(12) United States Patent
Tsuchi

(10) Patent No.: US 8,400,207 B2
(45) Date of Patent: Mar. 19, 2013

(54) LEVEL SHIFT CIRCUIT, AND DRIVER AND DISPLAY DEVICE USING THE SAME

(75) Inventor: Hiroshi Tsuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 432 days.

(21) Appl. No.: 12/847,339

(22) Filed: Jul. 30, 2010

(65) Prior Publication Data

US 2011/0050746 A1 Mar. 3, 2011

(30) Foreign Application Priority Data

Aug. 26, 2009 (JP) .................................. 2009-195930

(51) Int. Cl.
*H03L 5/00* (2006.01)

(52) U.S. Cl. .............................. 327/333; 326/82; 326/83

(58) Field of Classification Search ........................ None
See application file for complete search history.

(56) References Cited

U.S. PATENT DOCUMENTS

| 7,504,862 B2* | 3/2009 | De Sandre et al. ............. 326/81 |
| 8,243,003 B2* | 8/2012 | Tsuchi ........................... 345/100 |
| 2001/0013795 A1* | 8/2001 | Nojiri ............................. 326/81 |
| 2003/0234678 A1* | 12/2003 | Cleary et al. .................. 327/333 |
| 2005/0162209 A1* | 7/2005 | Dubey et al. ................... 327/333 |
| 2005/0258887 A1* | 11/2005 | Ito et al. ......................... 327/333 |
| 2009/0195291 A1* | 8/2009 | Tsuchi ........................... 327/333 |
| 2012/0146988 A1* | 6/2012 | Tsuchi ........................... 345/212 |

FOREIGN PATENT DOCUMENTS

| JP | 2003-152526 | 5/2003 |
| JP | 2009-199734 | 8/2009 |

* cited by examiner

*Primary Examiner* — Tuan T Lam

(74) *Attorney, Agent, or Firm* — Young & Thompson

(57) ABSTRACT

A level shift circuit includes a first circuit connected between a first power supply terminal (PST) and an output terminal (OT) of the level shift circuit to set OT to a first voltage (V1) when conducting, a second circuit connected between a second PST and OT to set OT to the second voltage (V2) when conducting, and a third circuit that receives an input signal and a feedback signal from OT so that, when OT=V2 and input=a third voltage (V3), the first circuit conducts, and when OT=V1, the first circuit is made nonconductive irrespective of the value of the input signal. The second circuit is made conductive and nonconductive, when the input=a fourth voltage (V4) and V3, respectively. A high/low relationship of V1, V2=that of V3, V4. The input between V3, V4 has a lower amplitude than the output signal between V1, V2.

8 Claims, 12 Drawing Sheets

LEVEL SHIFT CIRCUIT, AND DRIVER AND DISPLAY DEVICE USING THE SAME

CROSS-REFERENCE TO RELATED APPLICATION

This application is based upon and claims the benefit of the priority of Japanese patent application No. 2009-195930 filed on Aug. 26, 2009, the disclosure of which is incorporated herein in its entirety by reference thereto.

TECHNICAL FIELD

The present invention relates to a level shift circuit, and a driver and a display device using the level shift circuit.

BACKGROUND

In recent years, in the field of display units, displays using various display devices, such as liquid crystal display devices and displays using organic EL (Electroluminescence) elements have been developed. Image quality improvement (increase in the number of gray scales) are demanded for these display devices, and voltage amplitudes of a scanning signal and a gray scale signal tend to be increased. For this reason, each output section of a row driver that drives a scanning line of a display panel and a column driver that drives a data line of the display panel by a gray scale signal has been demanded to be adapted to high voltage.

On the other hand, high-speed transfer, low EMI (Electromagnetic Interference), and the like using a small number of interconnects are demanded for various control signals and a video data signal that are supplied to the row driver (scan driver) and the column driver (data driver) from a display controller. Thus, amplitudes of those signals are being reduced. Inside the row driver and the column driver as well, a fine process is adopted in order to reduce an increase in the area (increase in the cost) of a logic circuit that processes a data amount that will increase due to high definition and an increase in the number of gray scales, and a power supply voltage of the logic circuit tends to be reduced due to the fine process. That is, lowering of voltages of input sections of the row driver and the column driver and a high voltage of output sections of the row driver and the column driver are demanded.

For this reason, in a level shift circuit that converts a low voltage signal of its input unit to a high-voltage signal of its output unit, the low-amplitude signal must be converted to the high-amplitude signal at high speed.

As a configuration that performs level conversion of a low-amplitude signal to a high-amplitude signal at high speed, Patent Document 1, for example, discloses a configuration including a first converter 100, a second converter 200, and a latch unit 300, as shown in FIG. 11 (which is cited from FIG. 6 of Patent Document 1). The first converter includes a level converting unit 110, a delay unit 120, a self reset unit 130. The level converting unit 110 outputs a level converted signal having a level different from a level of an input signal according to the input signal. The delay unit 120 delays the level converted signal from the level converting unit 110 by a preset delay. The self reset unit 130 generates a reset signal responsive to the level-shifted signal delayed by the delay unit 120, and provides the reset signal to the level conversion unit 110, thereby setting a pulse width of the level-shifted output signal to the sum of the set delay and an internal operation delay. The second converter 200 includes a level converting unit 210, a delay unit 220, and a self reset unit 230.

Referring to FIG. 11, when an input signal DOU is applied like a waveform Apos in FIG. 12 (cited from FIG. 9 of Patent Document 1), the first converter 100 outputs a first converted signal B named as DOUO like a waveform B in FIG. 12 in response to a rising edge of the waveform Apos as indicated by reference symbol A1. Extension or reduction of a pulse width D1 of the first converted signal B is achieved by adjusting the number of inverters that constitute the delay unit 120. A pMOS transistor 331 in the latch unit 300 is made conductive when the waveform B is transitioned to a Low level. A High level of a second supply voltage VDDQ is applied to an input end of an inverter 333 that constitutes a latch L2. The inverter 333 performs an inverting operation to output a Low-level signal as shown in a waveform D in FIG. 12 through an output end named as DOUT. The Low-level signal is continuously maintained by a latch operation of the latch L2 even if the pMOS transistor 331 is made nonconductive by the waveform B that is returned to a High level. When the latch L2 is set to output the Low-level signal, the set operation is maintained until the operation is reset by a turning on operation of the nMOS transistor 332. Referring to the waveform D in FIG. 12, when the waveform Apos reaches a High level, the waveform D is immediately transitioned to a Low level. The output signal thus responses at the rising edge of the input signal at high speed. When an input signal DOD is applied like a waveform Aneg in FIG. 12, the second converter 200 outputs a second converted signal C like a waveform C in FIG. 12 in response to a rising edge of the waveform Aneg as indicated by reference symbol A2. When the waveform C is transitioned to a High level, an nMOS transistor 332 in the latch unit 300 is made conductive. Thus, the input end of the inverter 333 that constitutes the latch L2 goes Low, so that the latch L2 is reset. A High-level signal is output to the output end named as DOUT due to the operation of the inverter 333, as shown in the waveform D in FIG. 12. Even if the nMOS transistor 332 is made nonconductive, the High-level signal is continuously maintained due to the latch operation of the latch L2. When the latch L2 is reset so that the High-level signal is output, the reset operation is maintained until the pMOS transistor 331 is made conductive. Referring to the waveform D in FIG. 12, an output signal DOUT output as a single-ended signal has a pulse width matching the pulse width of each of the differential input signals DOU and DOD. An overall delay time of T1+T2 needed for level conversion is minimized, so that the output signal DOUT has a high-speed response characteristic.

[Patent Document 1] JP Patent Kokai Publication No. JP-P2003-152526A (FIGS. 6 and 9)

SUMMARY

The entire disclosure of the above patent document is incorporated herein by reference thereto. An analysis result of the related art by the present invention will be given below.

In the level shift circuit described with reference to FIGS. 11 and 12, level conversion can be performed at high speed. However, a lot of circuit elements are included in a cell reset portion. Thus, there is a problem that the circuit is complex, the number of circuit elements or devices is increased and area saving is difficult.

Accordingly, an object of the present invention is to provide a level shift circuit in which an increase in the number of elements is suppressed by simplifying a circuit configuration and which converts a low-amplitude input signal to a high-amplitude signal at high speed.

Another object of the present invention is to provide a multiple output driver and a display device including the driver which can achieve low power consumption and area saving (low cost) while achieving a high-speed operation, in the multiple output driver that needs a lot of level shift circuits.

In order to solve the above-mentioned problems, the invention disclosed in this application is generally configured as follows, though not limited thereto.

According to one aspect (aspect) of the present invention, there is provided a level shift circuit comprising: an input terminal supplied with an input signal that is to be level-shifted; an output terminal at which an output signal is outputted; a first power supply terminal supplied with a first voltage; a second power supply terminal supplied with a second voltage; a first circuit connected between the first power supply terminal and the output terminal, the first circuit setting the output terminal to the first voltage when made conductive; a second circuit connected between the second power supply terminal and the output terminal, the second circuit setting the output terminal to the second voltage when made conductive; a third circuit connected between the first power supply terminal and the second power supply terminal; and a feedback path connected between the output terminal and the third circuit to feed back the output signal at the output terminal to third circuit; the third circuit receiving the input signal from the input terminal and a feedback signal from the feedback path to perform control so as to make that the first circuit conductive when the feedback signal indicates that the output signal at the output terminal assumes a value corresponding to the second voltage and the input signal indicates a value corresponding to a third voltage, and to make the first circuit nonconductive, irrespective of the value of the input signal, when the feedback signal indicates that the output signal at the output terminal assumes a value corresponding to the first voltage, the second circuit being made conductive when the input signal assumes a value corresponding to a fourth voltage and being made nonconductive when the input signal assumes the value corresponding to the third voltage, a high/low relationship of the second voltage with respect to the first voltage being equal to a high/low relationship of the fourth voltage with respect to the third voltage, and the input signal whose amplitude range is between the third and fourth voltages having a lower amplitude than the output signal whose amplitude range is between the first and second voltages.

In the present invention, the feedback path comprises a first delay circuit that receives the output signal at the output terminal and delays the output signal received to supply the resulting delayed signal as the feedback signal to the third circuit.

According to another aspect of the present invention, there is provided a level shift circuit that comprises an input terminal supplied with an input signal that is to be level-shifted, an output terminal at which an output signal is outputted, a first power supply terminal supplied with a first voltage, a second power supply terminal supplied with a second voltage, first to third transistors connected in series between the first power supply terminal and the second power supply terminal, fourth and fifth transistors connected in series between the first power supply terminal and the second power supply terminal, and a first delay circuit having an input connected to a connection node of the fourth and fifth transistors to deliver a delayed signal having a phase reversed to a phase of a signal received at the input thereof. The connection node of the fourth and fifth transistors is connected to the output terminal. A control terminal of one of the second and third transistors and a control terminal of the first transistor is connected in common to an output of the first delay circuit. The input signal of an amplitude range between third and fourth voltages applied to the input terminal is supplied to a control terminal of the other of the second and third transistors. A connection node of the first transistor and the second transistor is connected to a control terminal of the fourth transistor. A complementary signal of the input signal is supplied to a control terminal of the fifth transistor. The first and fourth transistors are of a first conductivity type and the second, third, and fifth transistors are of a second conductivity type. In the present invention, the level shift circuit further comprises a first voltage holding circuit that controls to hold a voltage at a connection node, at which the connection node of the first and second transistors and the control terminal of the fourth transistor are connected together, to the first voltage. A high/low relationship of the second voltage with respect to the first voltage is equal to a high/low relationship of the fourth voltage with respect to the third voltage, and the input signal whose amplitude range is between the third and fourth voltages having a lower amplitude than the output signal whose amplitude range is between the first and second voltages.

According to the present invention, a small-amplitude input signal can be converted to a high-amplitude signal at high speed.

Further, according to another aspect of the present invention, duty corruption can be prevented, and a through current can be prevented with respect to waveform blunting of the input signal or the like.

According to the present invention, in a multiple-output driver that needs a lot of level shift circuits and a display device including the driver, a high-speed operation, low power consumption, and area saving or cost reduction are achieved.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES

Figure 1:
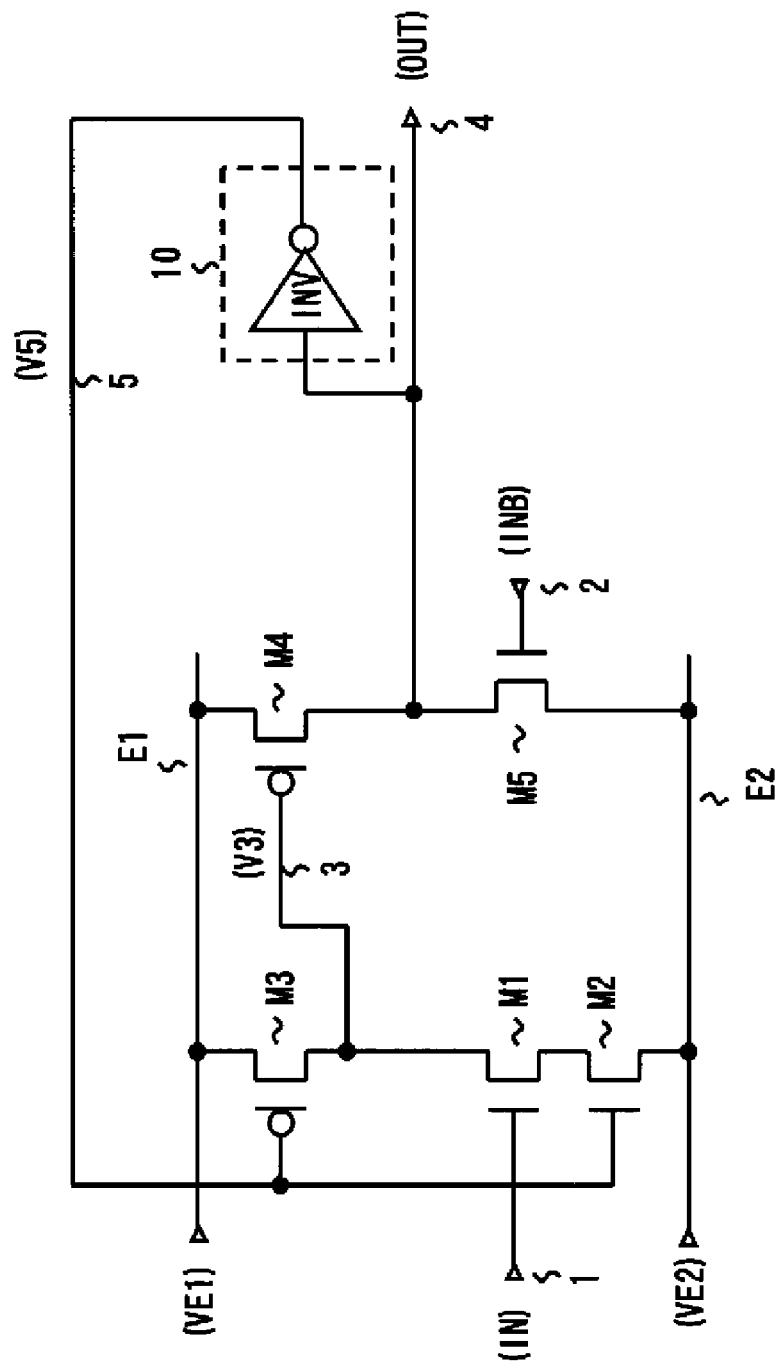
FIG. 1 is a diagram showing a configuration of a first exemplary embodiment of the present invention.

The present invention will be described. A level shift circuit according to one of preferred modes of the present invention includes a first circuit (transistor M4), a second circuit (transistor M5), and a third circuit (transistors M3, M1, M2). The first circuit (transistor M4) is connected between a first power supply terminal (E1) that supplies a first voltage (VE1) and an output terminal (4), and, when made conductive, sets the output terminal (4) to the first voltage (VE1). The second circuit (transistor M5) is connected between the output terminal (4) and a second power supply terminal (E2) that supplies a second voltage (VE2) and when made conductive sets the output terminal to the second voltage (VE2). The third circuit (transistors M3, M1, M2) receives a signal (V5) which is obtained by feeding back an output signal (OUT) of the output terminal (4) through a feedback path (first delay circuit 10 and a node 5). The third circuit (transistors M3, M1, M2) performs control so that, when the feedback signal (V5) indicates that the output signal (OUT) of the output terminal (4) assumes a value (such as a Low level of a high amplitude) corresponding to the second voltage (VE2) and an input signal (IN) assumes a value corresponding to a third voltage (VE3) (such as a High level of a low amplitude), the feedback signal (V5), the first circuit (M4) is made conductive, and that when the feedback signal (V5) indicates that the output signal (OUT) of the output terminal (4) assumes a value corresponding to the first voltage (VE1) (such as a High level of the high amplitude), the first circuit (M4) is made nonconductive irrespective of the value of the input signal (IN). The second circuit (M5) is made conductive when the input signal (IN) indicates a value corresponding to a fourth voltage (VE4) (Low level of the low amplitude), and is made nonconductive when the input signal (IN) indicates the value corresponding to the third voltage (VE3) (High level of the low amplitude).

In the present invention, a first delay circuit (10) is provided on the feedback path between the output terminal (4) and the third circuit (transistors M3, M1, and M2). The first delay circuit (10) receives the output signal (OUT) of the output terminal (4) and supplies a signal obtained by delaying the output signal out of phase by 180 degrees (inversion) to circuits (transistors M3 and M2) that form the third circuit, as the feedback signal.

Further, a level shift circuit according to another mode of the present invention includes a second delay circuit (20) that delays an output signal of an output terminal (4) in phase. The second circuit (transistor M5) is made conductive when an input signal (IN) indicates a value corresponding to a fourth voltage (VE4) (Low level of a low amplitude) and an output of the second delay circuit (20) indicates a value corresponding to a first voltage (VE1) (such as a High level of a high amplitude). The second circuit (transistor M5) is made nonconductive when the input signal (IN) indicates a value corresponding to a third voltage (VE3) (High level of the low amplitude) or the output of the second delay circuit (20) indicates a value corresponding to a second voltage (VE2) (such as a Low level of the high amplitude). With such a configuration, duty deterioration can be prevented, and a through current can be prevented against waveform blunting of the input signal. A description will be given below in connection with exemplary embodiments.

First Exemplary Embodiment

FIG. 1 is a diagram showing a configuration of a first exemplary embodiment of the present invention. Referring to FIG. 1, reference symbols IN and INB denote low-amplitude input signals each of which has an amplitude between third and fourth voltage levels of voltages (VE3 and VE4) and are complementary to each other. Reference symbol OUT denotes a high-amplitude output signal having an amplitude between first and second voltage levels of voltages (VE1 and VE2). Reference symbols VE1 and VE2 respectively denote a first supply voltage on a high potential side and a second supply voltage on a low potential side. Referring to FIG. 1, a relationship among the voltages VE1, VE2, VE3, and VE4 is set to VE2≦VE4<VE3<VE1.

Referring to FIG. 1, a level shift circuit in the first exemplary embodiment of the present invention includes: a pMOS transistor M3 that has a source connected to a first power supply terminal (E1) which supplies the first voltage level (VE1); an nMOS transistor M1 that has a drain connected to a drain of the pMOS transistor M3 and that receives the low-amplitude input signal (IN); an nMOS transistor M2 that has a drain connected to a source of the nMOS transistor M1 and a source connected to a second power supply terminal (E2) which supplies the second voltage level (VE2); a pMOS transistor M4 that has a source connected to the first power supply terminal (E1) and a gate connected to the drain of the pMOS transistor M3; an nMOS transistor M5 that has a drain connected to a drain of the pMOS transistor M4, a source connected to the second power supply terminal (E2), and a gate that receives the complementary signal (INB) of the input signal (IN); and a first delay circuit 10 that includes an inverter which has an input connected to an output terminal 4, which is a connection node of the drain of the pMOS transistor M4 and the drain of the nMOS transistor M5 and has an output connected to an output node 5.

Each pMOS transistor corresponds to a first conductivity type in claims, and each nMOS transistor corresponds to a second conductivity type in the claims.

The output node 5 of the first delay circuit 10 constitutes a feedback path of the output signal (OUT) and is connected to gates of the pMOS transistor M3 and the nMOS transistor M2 in common. Power supply voltages on high-potential and low-potential sides of the first delay circuit 10 are respectively set to VE1 and VE2, and the amplitude of the output node 5 is set to be between the voltage VE1 and the voltage VE2, though not limited thereto.

Figure 2:
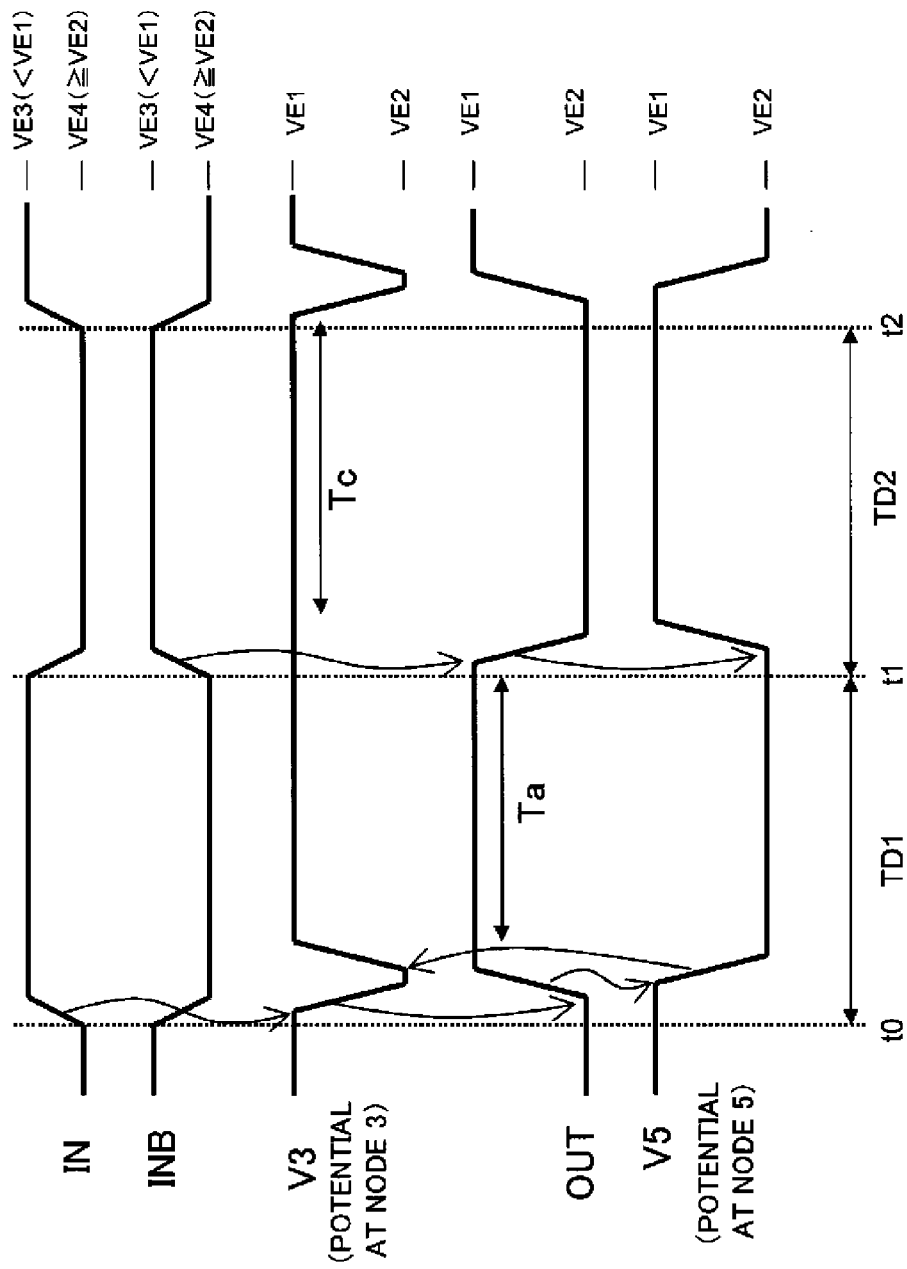
FIG. 2 is a diagram showing an example of a timing operation in the first exemplary embodiment of the present invention.

FIG. 2 is a voltage waveform diagram for explaining an operation of the circuit in FIG. 1. FIG. 2 shows the signals IN and INB each having an amplitude between the voltage VE3 and the voltage VE4, a voltage V3 at a node 3, an output signal voltage OUT of the output terminal 4, and a voltage V5 of an output of the first delay circuit 10 (voltage at the node 5).

Immediately before a timing t0, the low-amplitude input signal IN is set to be Low (VE4), the low-voltage input signal INB is set to be High (VE3), the nMOS transistor M1 is set to a nonconductive state, the nMOS transistor M5 is set to a conductive state, the output signal voltage OUT at the output terminal 4 is set to be Low, and the output V5 of the first delay circuit 10 is set to a High level, thereby setting the nMOS transistor M2 to be conductive and setting the pMOS transistor M3 to be nonconductive. Since the pMOS transistor M3 and the nMOS transistor M1 are in the nonconductive state, the node 3 is set to a floating state. Referring to FIG. 2, the node 3 is drawn to hold an immediately preceding High level.

When the input signal IN changes from the Low level (VE4) to the High level (VE3) at the timing t0 (at this time, the reverse-phase input signal INB changes from the High level to the Low level), the nMOS transistor M1 that receives the input signal IN at the gate thereof is made conductive. At the timing t0, a potential V5 at the node 5 is set to a High level, the nMOS transistor M2 is made conductive, and the pMOS transistor M3 is made nonconductive. For this reason, the voltage (V3) at the node 3 is reduced to the voltage VE2 (refer to the arrow line from the rising edge of the signal IN to the falling edge of the voltage V3 in FIG. 2).

As a result, the pMOS transistor M4 that receives the voltage (V3) at the node 3 at the gate thereof is made conductive. At the timing t0, the nMOS transistor M5 that has a gate supplied with the reverse-phase input signal INB which changes from High (VE3) to Low (VE4) is made nonconductive. The output terminal 4 is thereby charged from the high potential (VE1). The high-amplitude output signal OUT is set from the Low level (VE2) to the High level (VE1) (refer to the falling edge of the voltage 3 to the rising edge of the output OUT in FIG. 2).

Then, the voltage V5 at the output node 5 of the first delay circuit 10 that receives the output signal OUT at the High level (VE1) goes Low (VE2), so that the nMOS transistor M2 is made nonconductive, and the pMOS transistor M3 is made conductive. The voltage V3 at the node 3 is pulled up to the high potential VE1 (refer to the arrow line from the falling edge of the voltage V5 to the rising edge of the voltage V3 in FIG. 2).

As a result, the pMOS transistor M4 that has a gate supplied with the voltage V3 at the node 3 is made nonconductive. At this point, the reverse-phase input signal INB is at the Low level (VE2). Thus, the nMOS transistor M5 is made nonconductive (turned off), so that the output terminal 4 assumes the floating state. The High state of the output signal OUT at the output terminal 4 is stored and held at a parasitic capacitance of the output terminal 4 (capacitive load connected to the output terminal 4). A range of a waveform OUT in FIG. 2 indicated by reference symbol Ta indicates a period in which the output terminal 4 is in the floating state (IN=VE3, V5=VE2).

Next, when the input signal IN changes from the High level (VE3) to the Low level (VE4) and the reverse-phase input signal INB changes from the Low level (VE4) to the High level (VE3) at a timing t1, the nMOS transistor M1 is made nonconductive, and the nMOS transistor M5 is made conductive. At this point, the pMOS transistor M4 is kept nonconductive. Accordingly, charges at the output terminal 4 are discharged through the nMOS transistor M5 in the conductive state, so that the output signal OUT falls to the Low level (VE2) (refer to the arrow line from the rising edge of the input signal INB to the falling edge of the output signal OUT at the timing t1 in FIG. 2).

In response to this transition from High to Low of the output signal OUT, the output voltage V5 (potential at the node 5) of the first delay circuit 10 rises from Low to High (refer to the arrow from the falling edge of the output signal OUT to the rising edge of the voltage V5 in FIG. 2).

When the potential V5 at the node 5 is High, the pMOS transistor M3 is nonconductive. When the input signal IN is Low, the nMOS transistor M1 is nonconductive. Thus, the node 3 assumes the floating state, and the voltage at the node 3 is kept at the High level (VE1) that is the value before the timing t1. For this reason, the pMOS transistor M4 is also kept nonconductive. A range of a waveform V3 indicated by reference symbol Tc in FIG. 2 indicates a time period in which the node 3 is in the floating state (IN=VE4, V5=VE1).

Next, at a timing t2, the input signal IN changes from the Low level (VE4) to the High level (VE3), and the reverse-phase input signal INB changes from the High level (VE3) to the Low level (VE4). A circuit operation at this timing t2 is the same as the circuit operation at the timing t0. Thus, description of the circuit operation at the timing t2 will be omitted.

According to this embodiment, a charging operation and a discharging operation of each of the node 3 and the output terminal 4 (node 4) are not simultaneously generated. That is, when the charging operation (discharging operation) at the node 3 is performed, the discharging operation (charging operation) at the node 3 is not performed. When the charging operation (discharging operation) at the output terminal 4 is performed, the discharging operation (charging operation) of the output terminal 4 is not performed. For this reason, it is possible for the circuit to achieve a high-speed operation.

In this embodiment, the first delay circuit 10 may be configured to invert and output an input signal, and may be formed of an odd number of cascade-connected inverters or the like. Referring to FIG. 1, the first delay circuit 10 is formed of one stage of the inverter (INV). As will be described later, the first delay circuit 10 may be formed of an odd number (such as three) of stages of inverters.

This embodiment is illustrated as a preferred configuration in which the High levels (VE3) of the input signal IN and the complementary signal INB are level shifted in a large extent to the high potential (VE1). Assume the case of a preferred configuration in which the Low levels (VE4) of the input signal IN and the complementary signal INB are greatly level shifted to the low potential (VE2). Then, by interchanging the order of potentials of the supply voltages to (VE1≦VE3<VE4<VE2) and interchanging the conductivity types of the respective transistors (by changing the pMOS transistor to an nMOS transistor and changing the nMOS transistor to a pMOS transistor) in FIG. 1, the preferred configuration can be readily implemented though a drawing of the preferred configuration is omitted.

Second Exemplary Embodiment

Figure 3:
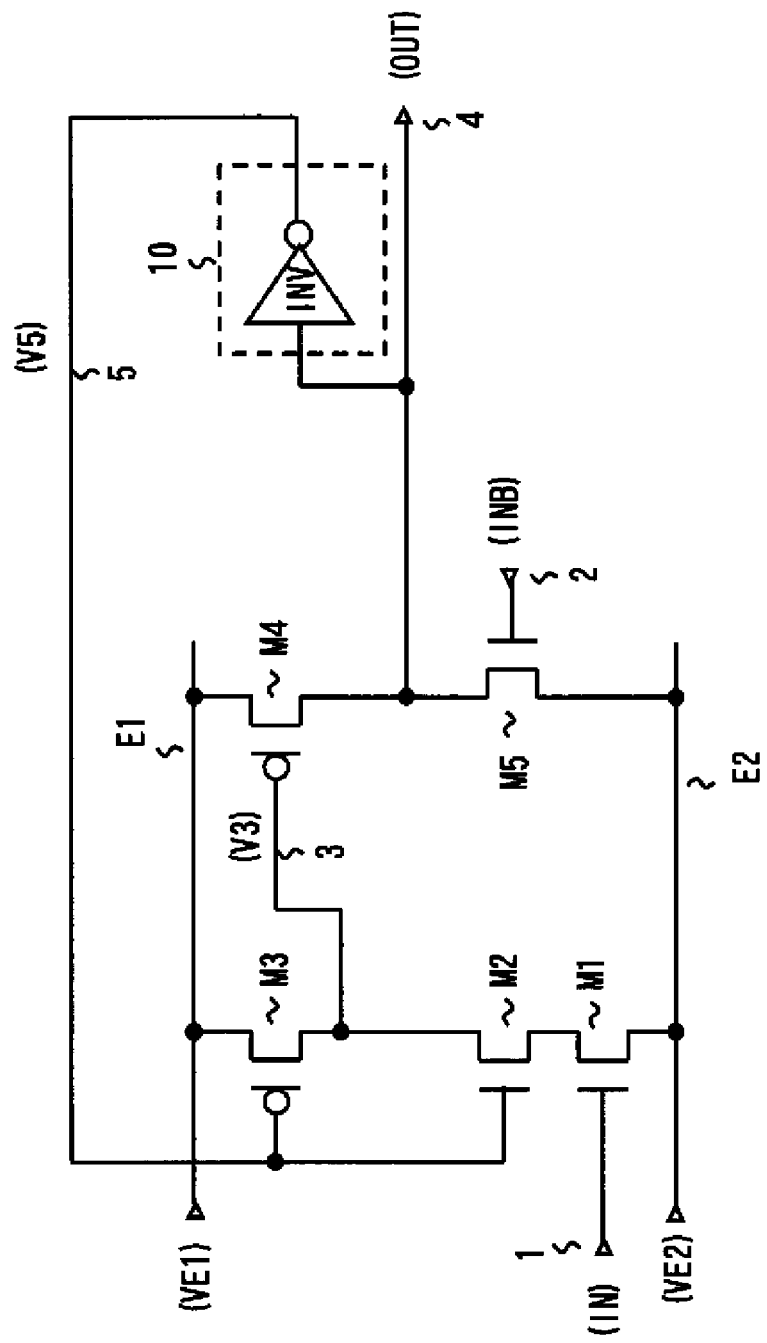
FIG. 3 is a diagram showing a configuration of a second exemplary embodiment of the present invention.

A second exemplary embodiment of the present invention will be described. FIG. 3 is a diagram showing a configuration of the second exemplary embodiment of the present invention. Referring to FIG. 3, this exemplary embodiment is obtained by interchanging connection between the nMOS transistors M1 and M2 in the configuration shown in FIG. 1. That is, a source of an nMOS transistor M1 that receives an input signal IN at a gate thereof is connected to a second power supply terminal (E2). Then, an nMOS transistor M2 that receives an output 5 of a first delay circuit 10 is connected between a node 3 and a drain of the nMOS transistor M1. In such a configuration as well, operations similar to those in the first exemplary embodiment are performed.

Third Exemplary Embodiment

Figure 4:
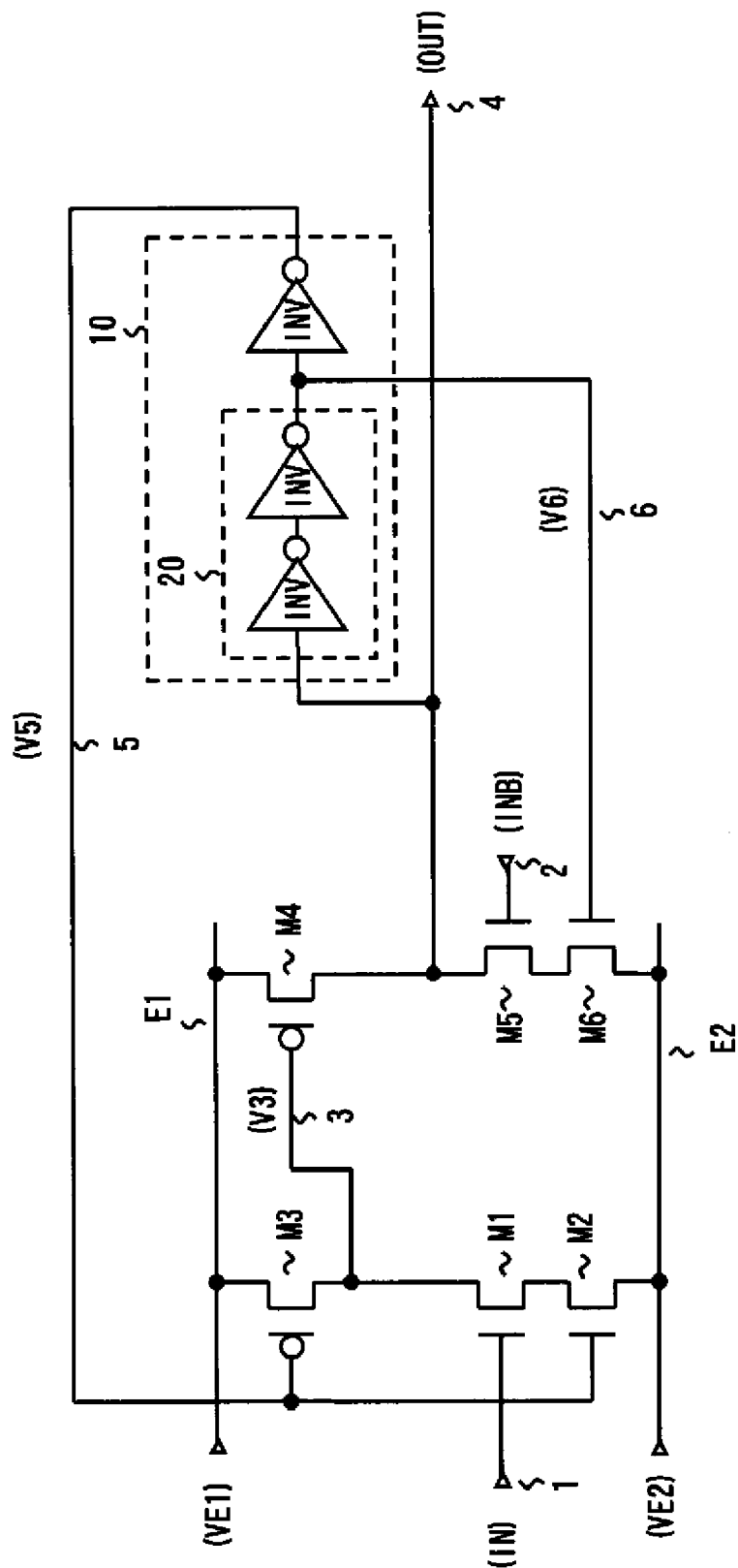
FIG. 4 is a diagram showing a configuration of a third exemplary embodiment of the present invention.

Next, a third exemplary embodiment of the present invention will be described. FIG. 4 is a diagram showing a configuration of the third exemplary embodiment of the present invention. Referring to FIG. 4, the third exemplary embodiment of the present invention includes nMOS transistors M5 and M6 connected in series between a second power supply terminal E2 and an output terminal 4. As in the first exemplary embodiment in FIG. 1, a drain of the nMOS transistor M5 is connected to an output terminal 4, and the nMOS transistor M5 receives an input signal INB at a gate thereof. A drain of the nMOS transistor M6 is connected to a source of the nMOS transistor M5, and a source of the nMOS transistor M6 is connected to a second power supply terminal E2. The nMOS transistor M6 receives a delayed signal having a same phase as an output signal OUT. In this exemplary embodiment as well, the order of connection between the nMOS transistors M5 and M6 may be interchanged, as in the second exemplary embodiment in which the connection between the nMOS transistors M1 and M2 are interchanged with respect to the first exemplary embodiment.

This exemplary embodiment is also illustrated as a preferred configuration in which High levels (VE3) of input signals IN and the INB are level shifted by a large amount to a high potential (VE1). In the case of implementing a configuration in which Low levels (VE4) of the input signal IN and the complementary signal INB are level shifted by a large amount to a low potential (VE2), by interchanging the order of potentials of the supply voltages to (VE1≦VE3<VE4<VE2) and interchanging the conductivity type of each transistor (by changing the pMOS transistor to the nMOS transistor and changing the nMOS transistor to the pMOS transistor), the configuration can be readily implemented.

The first delay circuit 10 is formed of an odd number of stages of inverters that receive the output signal OUT and outputs a reverse-phase delay signal (V5) of the output signal OUT to a node 5. A second delay circuit 20 is formed of an even number of stages of inverters that output to a node 6 a delayed signal (V6) having a same phase as the output signal OUT. In the exemplary embodiment of FIG. 4, there is shown the configuration in which the second delay circuit 20 is included in the first delay circuit 10. A configuration in which the first delay circuit 10 is included in the second delay circuit 20 may be employed. Though no particular limitation is imposed, the second delay circuit 20 is formed of two stages of the inverters INV, and the first delay circuit 10 is formed of three stages of the inverters, which is the sum of the two stages of the inverters INV of the second delay circuit 20 and one stage inverter that receives an output of the second delay circuit 20.

According to this exemplary embodiment, even if the input signal IN and the complementary signal of the input signal IN have fairly blunted waveforms, duty characteristics of the input signal IN and the complementary signal are kept satisfactory. As a result, power reduction and a high-speed operation can be realized.

Figure 5:
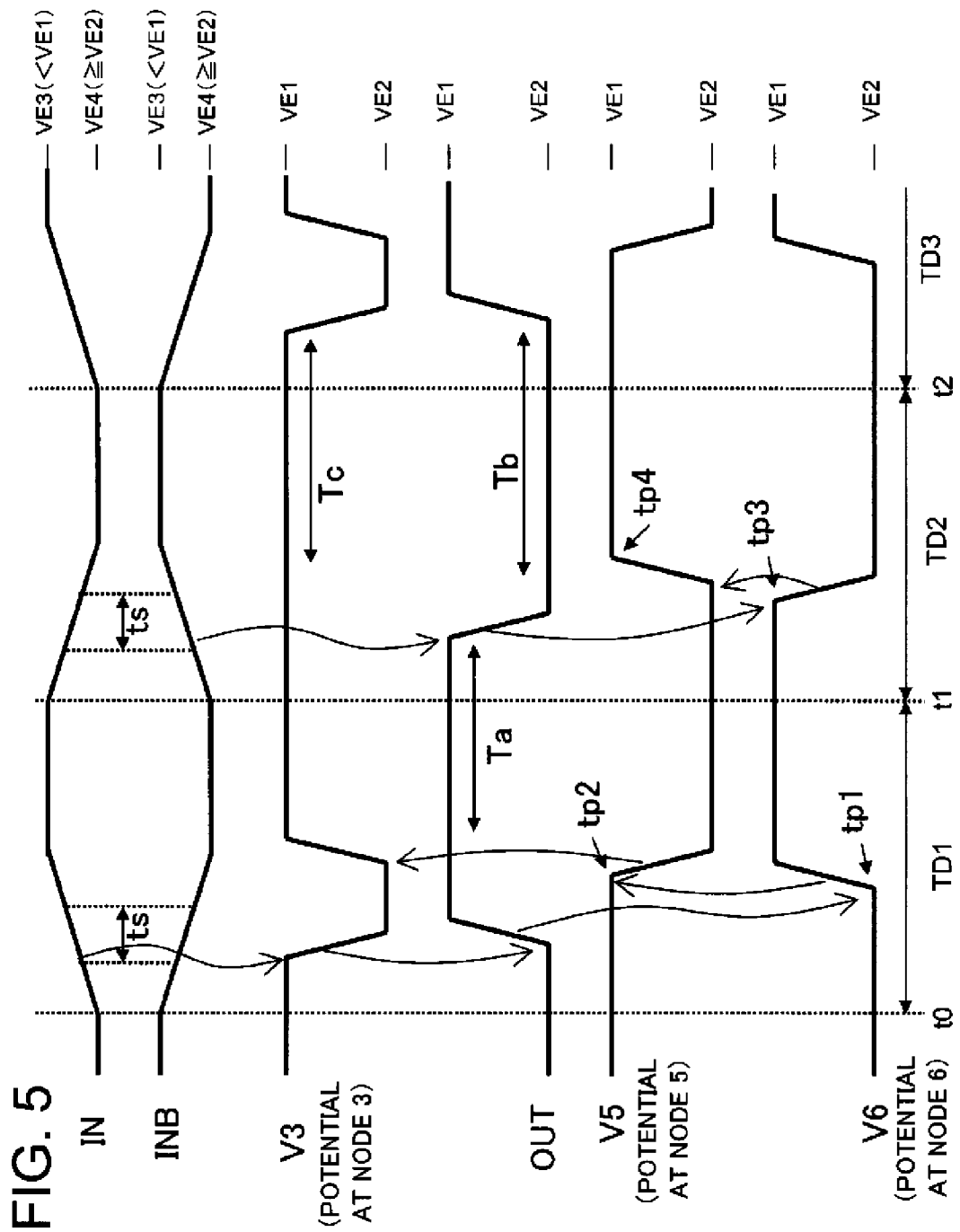
FIG. 5 is a diagram showing an example of a timing operation in the third exemplary embodiment of the present invention.

FIG. 5 is a voltage waveform diagram for explaining an operation of the circuit in FIG. 4. FIG. 5 shows the input signals IN and INB (each having an amplitude between the voltage VE3 and the voltage VE4), a voltage V3 at a node 3, an output signal voltage OUT of the output terminal 4, a voltage V5 (voltage at the node 5) of an output of the first delay circuit 10, and a voltage V6 (voltage at the node 6) of an output of the second delay circuit 20.

Slew rates of rises and falls of the input signals IN and INB are reduced due to waveform blunting. In a time segment is at rise and fall transitions of the input signals IN and INB in FIG. 5, both of an nMOS transistor M1 and the nMOS transistor M5 are made conductive (turned on).

Immediately before a timing t0, the low-amplitude input signal IN is set to be Low (VE4), the low-amplitude input signal INB is set to be High (VE3), the nMOS transistor M1 is set to a nonconductive state, and the nMOS transistor M5 is set to a conductive state. The output signal OUT of the output terminal 4 is brought into a floating state at the low level (VE2) (because the pMOS transistor M4 and the nMOS transistor M6 are off). The output V5 of the first delay circuit 10 is set to be High (VE1) and the output V6 of the second delay circuit 20 is set to be Low (VE2), thereby setting an nMOS transistor M2 to be conductive and setting a pMOS transistor M3 to be nonconductive. At this point, the nMOS transistor M1 is nonconductive. Thus, the node 3 is set to be in the floating state of High (VE1).

When the input signal IN changes from the Low level (VE4) to the High level (VE3) at the timing t0 (at this point, the reverse-phase input signal INB changes from the High level to the Low level), the nMOS transistor M1 that receives the input signal IN at a gate thereof is made conductive. At this point, a potential V5 at the node 5 is set to be High (VE1), the nMOS transistor M2 is made conductive, and the pMOS transistor M3 is made nonconductive. For this reason, the voltage (V3) at the node 3 falls to the voltage VE2 (refer to the arrow line from the rising edge of the signal IN to the falling edge of the voltage V3 in FIG. 5).

As a result, the pMOS transistor M4 that receives the voltage (V3) at the node 3 at a gate thereof is made conductive. The output signal voltage OUT at the output terminal 4 is thereby charged to the high potential (VE1). The high-amplitude output signal OUT is set from the Low level (VE2) to the High level (VE1) (refer to the arrow line from the falling edge of the voltage V3 to the rising edge of the output OUT in FIG. 5). Since the slew rate of the fall of the reverse-phase input signal INB that changes from High (VE3) to Low (VE4) at the timing t0 is small, the nMOS transistor M6 is not conductive on even in a period is where the nMOS transistor M5 is made conductive simultaneously with the nMOS transistor M1. Thus, a current path between the output terminal 4 and the second power supply terminal E2 is cut off. For this reason, for the input signal INB having a low fall slew rate, the output terminal 4 is charged from the High level (VE1) to cause the high-amplitude output signal OUT to change from the Low level (VE2) to the High level (VE1). That is, the output signal OUT is not affected by waveform blunting of the input signals IN and INB. Thus, the duty ratio of the output signal is not varied.

Upon receipt of transition of the output signal OUT from Low (VE2) to High (VE1), the output V6 of the second delay circuit 20 transitions from Low (VE2) to High (VE1) after a predetermined delay time (tp1) (refer to the arrow line from the rising edge of the output signal OUT to the rising edge of the output V6 in FIG. 5), and the nMOS transistor M6 assumes the conduction state (turns on).

The waveform of a potential V6 at the node 6 in FIG. 5 indicates a signal obtained by delaying the output signal OUT in phase. The delay time tp1 at a time of start of the rise of a waveform V6 corresponds to a delay time of the second delay circuit 20 (two stages of inverters) from the rising edge of the output signal OUT.

The waveform of the potential V5 at the node 5 in FIG. 5 indicates a signal obtained by delaying the potential V6 (output signal OUT) at the node 6 out of phase by 180 degrees. A time tp2 at the start of the fall of a waveform V5 corresponds to a delay time of one stage inverter of the first delay circuit 10 from the rising edge of the potential V6 at the node 6. That is, the waveform of the potential V6 at the node 6 indicates a signal obtained by delaying the output signal OUT in phase by the time tp1. The delay time of the first delay circuit 10 is set so that the delay time tp1 is temporally located after the transition time is for the input signals.

After the predetermined delay time from the rise of the output V6 of the second delay circuit 20, the voltage V5 at the output node 5 of the first delay circuit 10 falls from High (VE1) to Low (VE2) (refer to the arrow line from the rising edge of the voltage V6 to the falling edge of the voltage V5). For this reason, the nMOS transistor M2 is made nonconductive, and the pMOS transistor M3 is made conductive. As a result, the node 3 is charged, and a potential V3 at the node 3 goes High (VE1) (refer to the arrow line from the falling edge of the voltage V5 to the rising edge of the voltage V3 in FIG. 5).

The pMOS transistor M4 that receives the voltage V3 at the High level as a gate potential is made nonconductive. At this point, the nMOS transistor M5 that receives the reverse-phase input signal INB at the gate thereof is nonconductive. As a result, the output terminal 4 is brought into the floating state at the High level (VE1). In the exemplary embodiment shown in FIG. 5, the High level (VE1) of the output signal OUT at the output terminal 4 is stored and held at a parasitic capacitance of the output terminal 4 (capacitive load connected to the output terminal 4) or the like. A range of an output signal waveform OUT in FIG. 5 indicated by reference symbol Ta indicates a period in which the output terminal 4 is High (VE1) in the floating state (INB≅VE4, V3=VE1).

Next, at a timing t1, the input signal IN changes from the High level (VE3) to the Low level (VE4), and the reverse-phase input signal INB changes from the Low level (VE4) to the High level (VE3). Since the potential at the node 3 is High immediately after the timing t1, the pMOS transistor M4 is kept nonconductive. Since the potential V6 at the node 6 is High, the nMOS transistor M6 is kept conductive. When a voltage of the reverse-phase input signal INB assumes the threshold voltage of the nMOS transistor or higher, the nMOS transistor M5 is made conductive. Electric charge at the output terminal OUT is discharged, and the output terminal OUT falls from High (VE1) to Low (VE2) (refer to the arrow line from the rise of the signal INB to the falling edge of the output signal OUT in FIG. 5).

At this point, the potential at the node 5 is Low (VE2). Thus, the nMOS transistor M2 is kept nonconductive. The slew rates of the fall and the rise of the complementary input signals IN and INB are small (rise and fall times are long). For this reason, during the transition period ts of the complementary input signals IN and INB, both of the nMOS transistors M1 and M5, which should have originally been turned off and turned on, respectively, may be turned on (when respective voltages of the input signals IN and INB are twice a threshold voltage VT of the nMOS transistor or higher). However, in the period ts after the timing t1, the potential at the node 5 is kept Low, and the nMOS transistor M2 is kept. Thus, even if the nMOS transistor M1 is made conductive, a path between the node 3 and the second power supply terminal E2 remains cut off. The pMOS transistor M3 is kept on, and the node 3 is maintained High (VE1). Accordingly, the pMOS transistor M4 is kept nonconductive. The potential V6 at the node 6 falls, being delayed by a delay time tp3 from the falling edge of the output signal OUT from High to Low (refer to the arrow line from the falling edge of the output signal OUT to the falling edge of the potential V6 in FIG. 5). This delay time tp3 is a delay time TPLH of the second delay circuit 20 (which is a propagation delay time of a rise of the output with respect to a fall of the input).

Then, after a delay of one stage inverter of the first delay circuit 10 from the fall of the potential V6 at the node 6, the potential V5 at the node 5 rises from Low (VE2) to High (VE1) (refer to the arrow line from the falling edge of the potential V6 to the rising edge of the potential V5). When the potential V5 at the node 5 goes High (VE1), the pMOS transistor M3 is made nonconductive. Further, the nMOS transistor M1 that receives the input signal at the Low level (VE4) at the gate thereof is also kept nonconductive. Thus, the node 3 assumes the floating state at the High level (VE1). That is, when the input signal IN≅VE4 and the potential V5 at the node 5 is VE1, the node 3 assumes the floating state at the High level (VE1) (refer to a time range of a waveform V3 indicated by reference symbol Tc in FIG. 5). Accordingly, in this case, the high level of the node 3 is held at its parasitic capacitance or the like, and the pMOS transistor M4 is kept nonconductive. When the potential V6 at the node 6 falls to Low, the nMOS transistor M6 is made nonconductive, and the output terminal 4 is brought into the floating state at the Low (VE2) level. That is, when the potential V3 at the node 3 is VE1 and the potential V6 at the node 6 is VE2, the output terminal 4 is brought into the floating stage at the Low (VE2) level (as shown in a time range of the output signal voltage OUT indicated by reference symbol Tb in FIG. 5).

Next, at a timing t2, the input signal IN changes from the Low level (VE4) to the High level (VE3), and the reverse-phase input signal INB changes from the High level (VE3) to the Low level (VE4). A circuit operation at this timing t2 is the same as the circuit operation at the timing t0. Thus, description of the circuit operation at the timing t2 will be omitted.

Fourth Exemplary Embodiment

Figure 6:
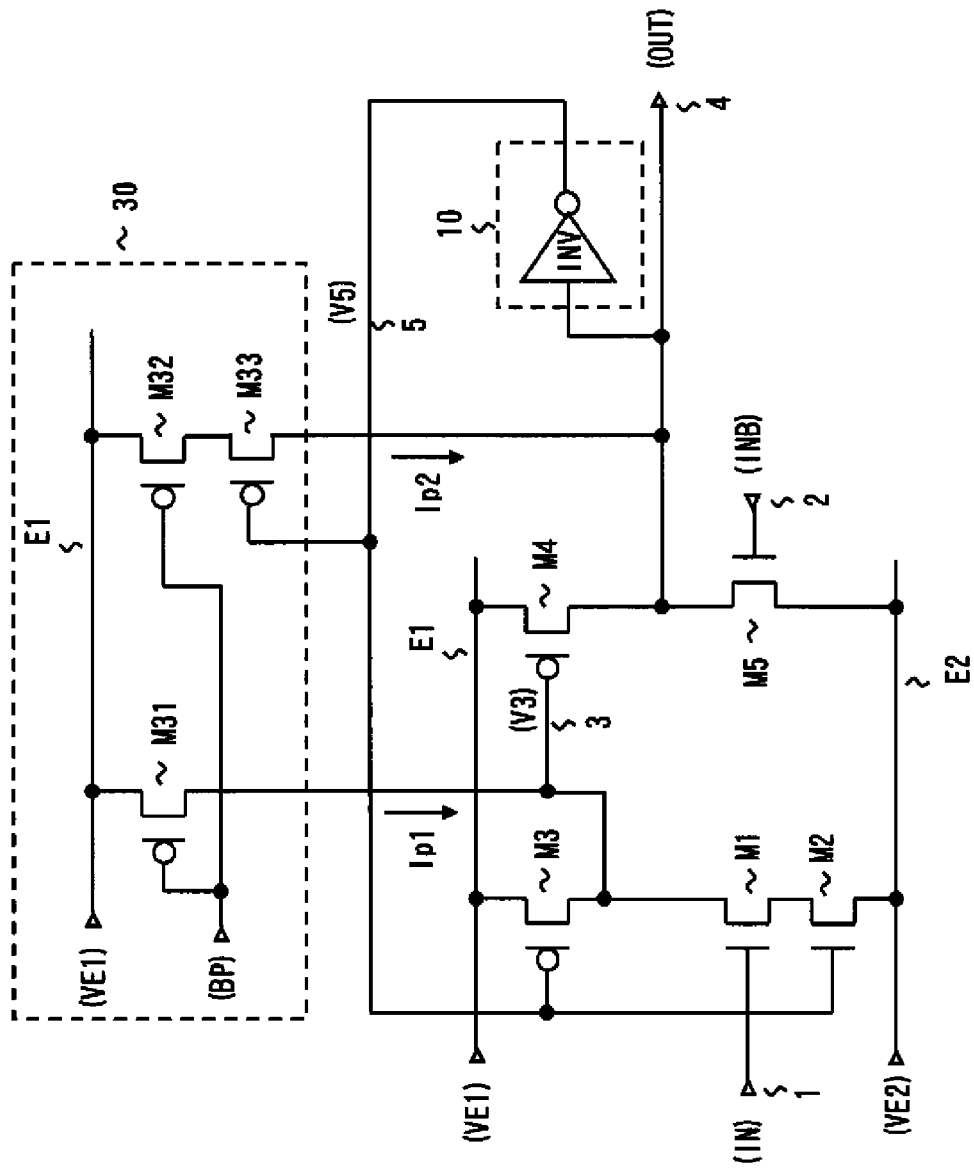
FIG. 6 is a diagram showing a configuration of a fourth exemplary embodiment of the present invention.

Next, a fourth exemplary embodiment of the present invention will be described. FIG. 6 is a diagram showing a configuration of the fourth exemplary embodiment of the present invention. In this exemplary embodiment, a first voltage holding circuit 30 is further added to the configuration in FIG. 1. Other configurations are the same as those in the first exemplary embodiment in FIG. 1. A difference from the first exemplary embodiment will be described below. Description of the same components will be omitted as necessary, in order to avoid repetition.

Referring to FIG. 6, the first voltage holding circuit 30 includes a pMOS transistor M31 that has a source connected to a first power supply terminal E1 and a drain connected to a node 3, a pMOS transistor M32 that has a source connected to the first power supply terminal E1, and a pMOS transistor M33 that has a source connected to a drain of the pMOS transistor M32, a gate connected to a node 5 (an output of a first delay circuit 10), and a drain connected to an output terminal 4. The pMOS transistor (current source transistor) M31 receives a bias voltage (BP) at a gate thereof. The pMOS transistor (current source transistor) M32 receives the bias voltage (BP) at a gate thereof.

The first voltage holding circuit 30 operates to supply a current Ip1 from the drain of the pMOS transistor M31 to the node 3, thereby keeping a potential V3 of the node 3 at a High level (VE1) during the period Tc (during which the node 3 is in the floating state) shown in FIG. 2.

Further, the first voltage holding circuit 30 supplies a current Ip2 from the drain of the pMOS transistor M33 to the output terminal 4, thereby keeping an output signal voltage OUT at the High level (VE1) during the period Ta shown in FIG. 2.

When the output terminal 4 goes Low (VE2) and a potential V5 at the node 5 is High (VE1), the pMOS transistor 33 is brought into a nonconductive state (turned off) and the current Ip2 is interrupted.

On the other hand, during a period in which a voltage V3 at the node 3 is Low (VE2), or when both of the nMOS transistors M1 and M2 are conductive, the current Ip1 flows from the pMOS transistor M31 to a second power supply terminal E2 through the node 3. However, otherwise, or during a period in which the voltage V3 of the node 3 is High, a path between the nMOS transistors M1 and M2 is nonconductive, a pMOS transistor M3 is made conductive or nonconductive. A current path between the first power supply terminal E1 and the second power supply terminal E2 is cut off. Thus, the current Ip1 scarcely flows.

Fifth Exemplary Embodiment

Figure 7:
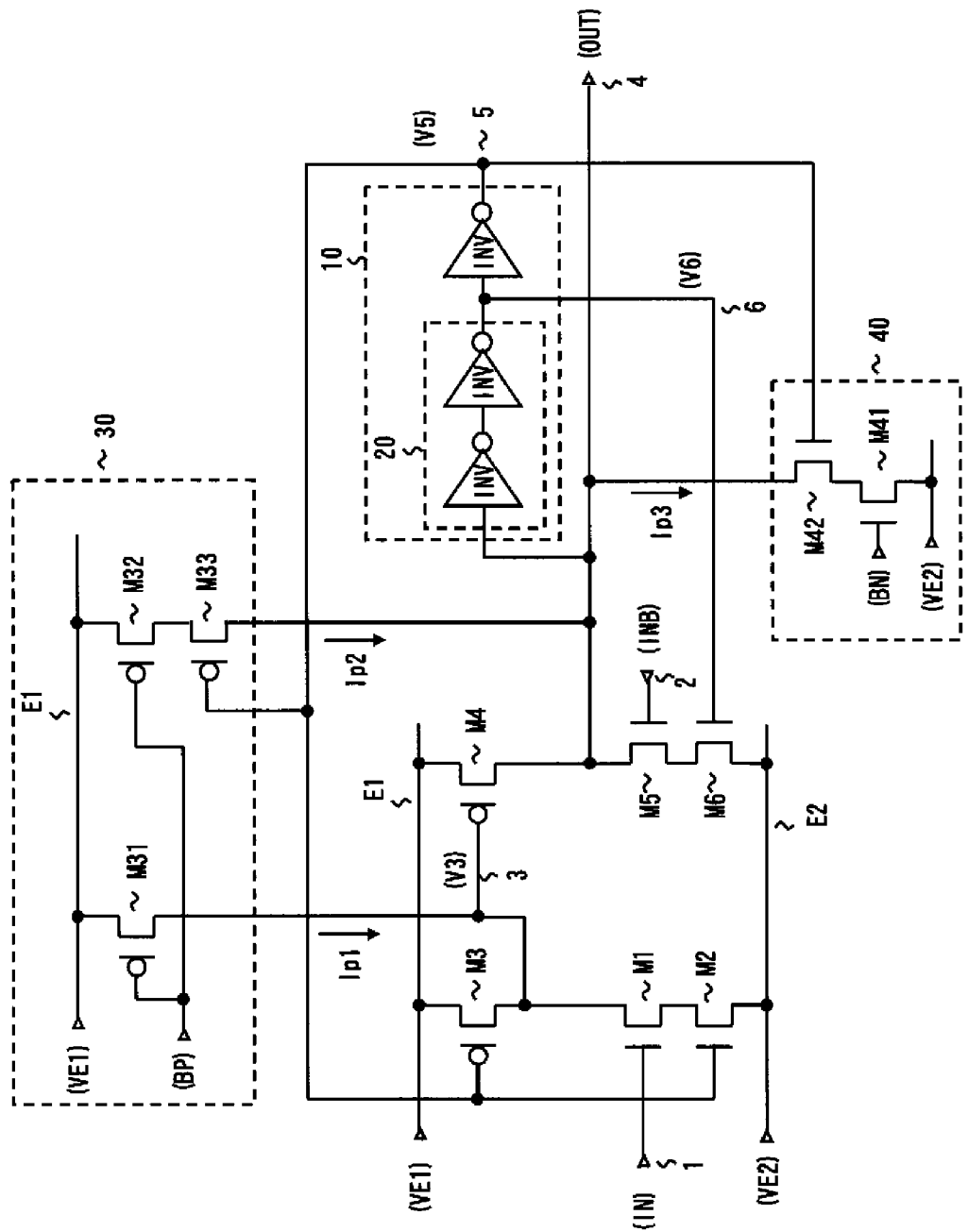
FIG. 7 is a diagram showing a configuration of a fifth exemplary embodiment of the present invention.

Next, a fifth exemplary embodiment of the present invention will be described. FIG. 7 is a diagram showing a configuration of the fifth exemplary embodiment of the present invention. This exemplary embodiment is obtained by adding the first voltage holding circuit 30 described with reference to FIG. 6 and further a second voltage holding circuit 40 to the configuration of the third exemplary embodiment shown in FIG. 4. Other configurations are the same as those in the third exemplary embodiment in FIG. 4. A difference from the third exemplary embodiment will be described below. Description of components that are the same as those in the third exemplary embodiment will be omitted as necessary in order to avoid repetition.

The second voltage holding circuit 40 includes an nMOS transistor M41 that has a source connected to a second power supply terminal E2 and an nMOS transistor M42 that has a source connected to a drain of the nMOS transistor M41, a drain connected to an output terminal 4, and a gate connected to an output node 5 of a first delay circuit 10. The nMOS transistor M41 receives a bias voltage BN at a gate thereof.

The second voltage holding circuit 40 operates to supply a sink current IP3 (having a current value of the current source transistor M41) from the drain of the nMOS transistor M42 to the output terminal 4, thereby keeping an output signal voltage OUT at a Low level (VE2) during the period Tb shown in FIG. 5. When a node 5 is Low (VE2) (when the output signal voltage OUT is High (VE1)), the nMOS transistor M42 is made nonconductive. The current IP3 is thereby interrupted. When the output terminal 4 is High, a current path between the output terminal 4 and the second power supply terminal E2 is cut off in the second voltage holding circuit 40. Thus, the current Ip3 scarcely flow except when an output signal OUT varies.

<Consideration of Waveform Blunting of Input Signal>

Figure 8:
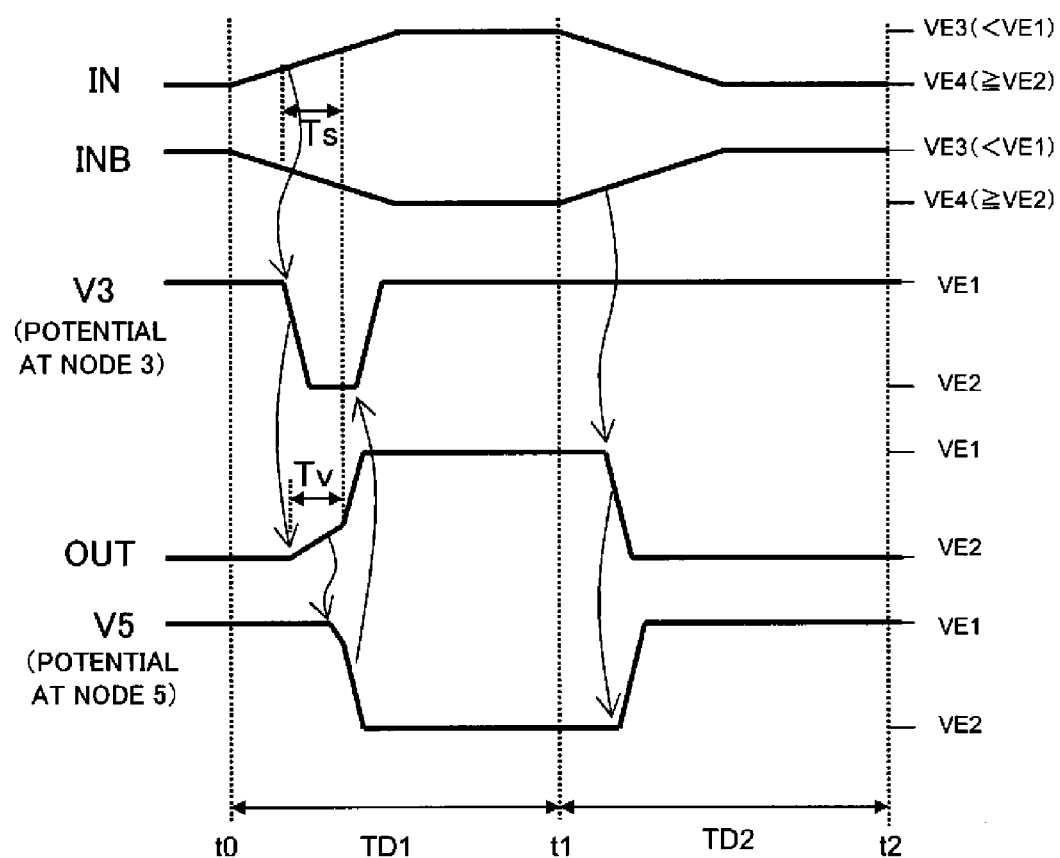
FIG. 8 is a diagram showing an example of a timing operation in the first exemplary embodiment of the present invention.

FIG. 8 shows a case where the input signals IN and INB are blunt in the first exemplary embodiment shown in FIG. 1. In a period Ts in which the complementary input signals IN and INB respectively rise and fall, a gate-to-source potential of each of the nMOS transistors M1 and M5 may become higher than or equal to the threshold voltage. The nMOS transistors M1 and M5 may be thereby simultaneously made conductive. A through current may flow between the first power supply terminal E1 and the second power supply terminal E2 in a period Tv. A duty ratio may also thereby deteriorate.

That is, when the input signal IN rises (when the reverse-phase input signal INB falls), the potential at the node 5 is kept High (VE1), the nMOS transistor M2 is kept on, and the pMOS transistor M3 is kept nonconductive. At this point, when the nMOS transistors M1 and M5 are conductive, the node 3 is driven Low. Then, the pMOS transistor M4 is made conductive, and the nMOS transistor M5 is kept on, so that the through current flows. When the node 5 changes to Low (VE2) due to rise of the output signal voltage OUT, the pMOS transistor M3 is made conductive, and the through current flows through a current path among the pMOS transistor M3 and the nMOS transistors M1 and M2.

The first exemplary embodiment in FIG. 1 can be applied when waveform blunting of the input signals is small. When waveform blunting of the input signals is large, or when waveform blunting needs to be considered, the circuit configuration in each of FIG. 4, 7, or the like is used.

Sixth Exemplary Embodiment

Figure 9:
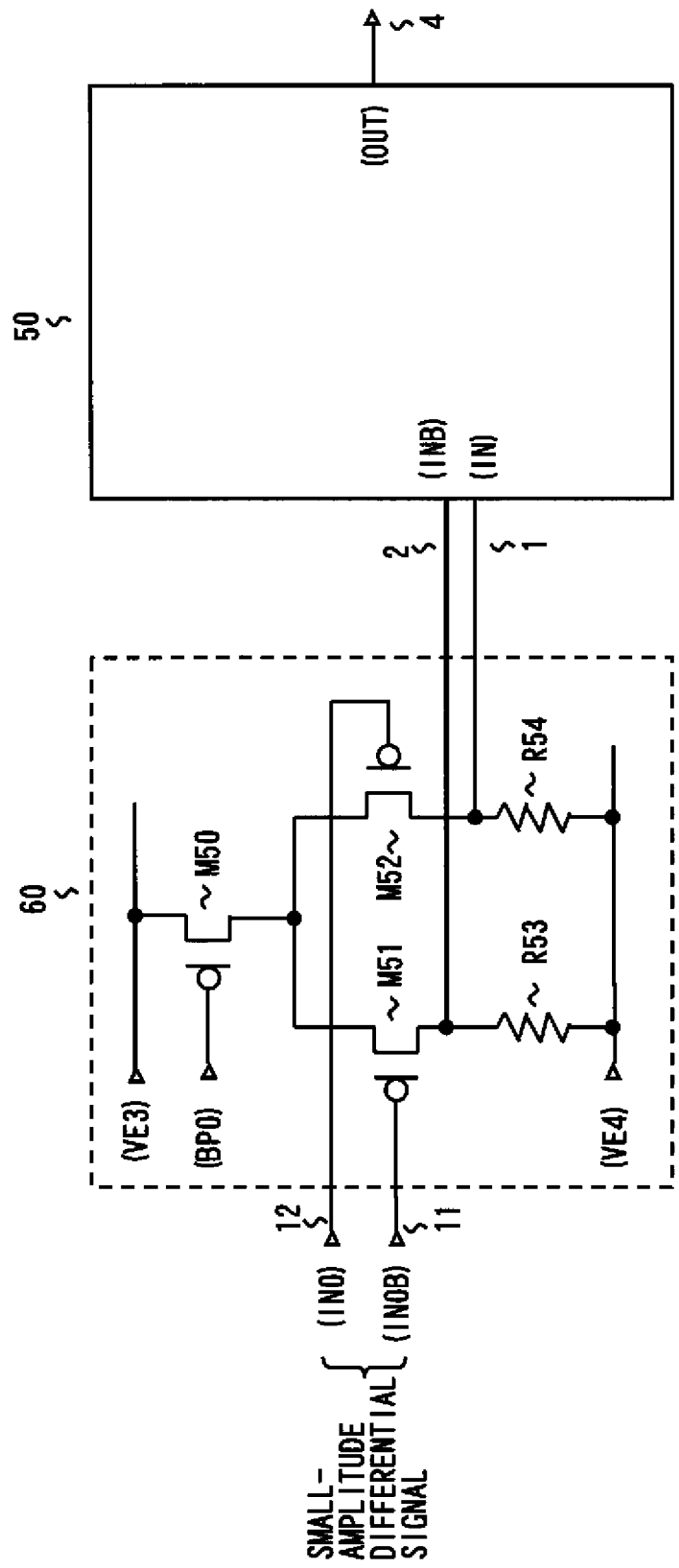
FIG. 9 is a diagram showing a configuration of a sixth exemplary embodiment of the present invention.

Next, a sixth exemplary embodiment of the present invention will be described. FIG. 9 is a diagram showing a configuration exemplary embodiment when a level shift circuit (level conversion circuit) 50 of the present invention is used for a data receiver circuit of a display driver. Referring to FIG. 9, the configuration in each of FIGS. 1, 3, 4, 6, and 7 can be used as the level shift circuit 50. However, when waveform blunting of the complementary input signals IN and INB is large, the configuration in FIG. 4 or 7 is preferred.

A differential amplifier circuit (receiver) 60 includes a pMOS transistor (current source transistor) M50 with a source thereof connected to a power supply VE3, a differential pair (pMOS transistors M51 and M52) having coupled sources connected to a drain of the pMOS transistor (current source transistor) M50, and load elements R53 and R54 connected between a power supply VE4 and drains of the pMOS transistors M51 and M52. The pMOS transistor receives a bias voltage BP at a gate thereof. The differential pair receives differential signals IN0 and IN0B of a small amplitude at gates thereof. Terminal voltages of the load elements R53 and R54 are connected to input terminals 1 and 2 of the level shift circuit 50. When blunting of differential outputs of the differential amplifier circuit (receiver) 60 is great, duty ratio deterioration can be avoided by using the configuration in FIG. 4 or 7.

Seventh Exemplary Embodiment

Figure 10:
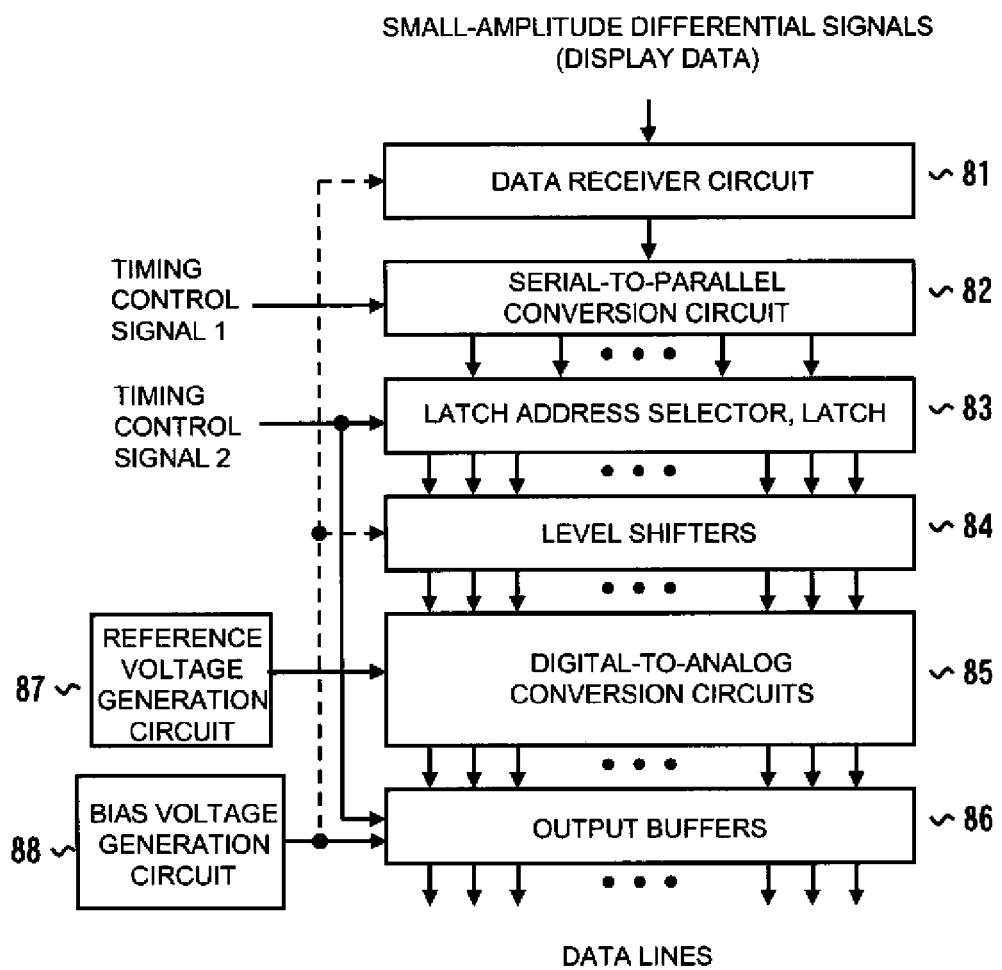
FIG. 10 is a diagram showing a configuration of a seventh exemplary embodiment of the present invention.
Figure 11:
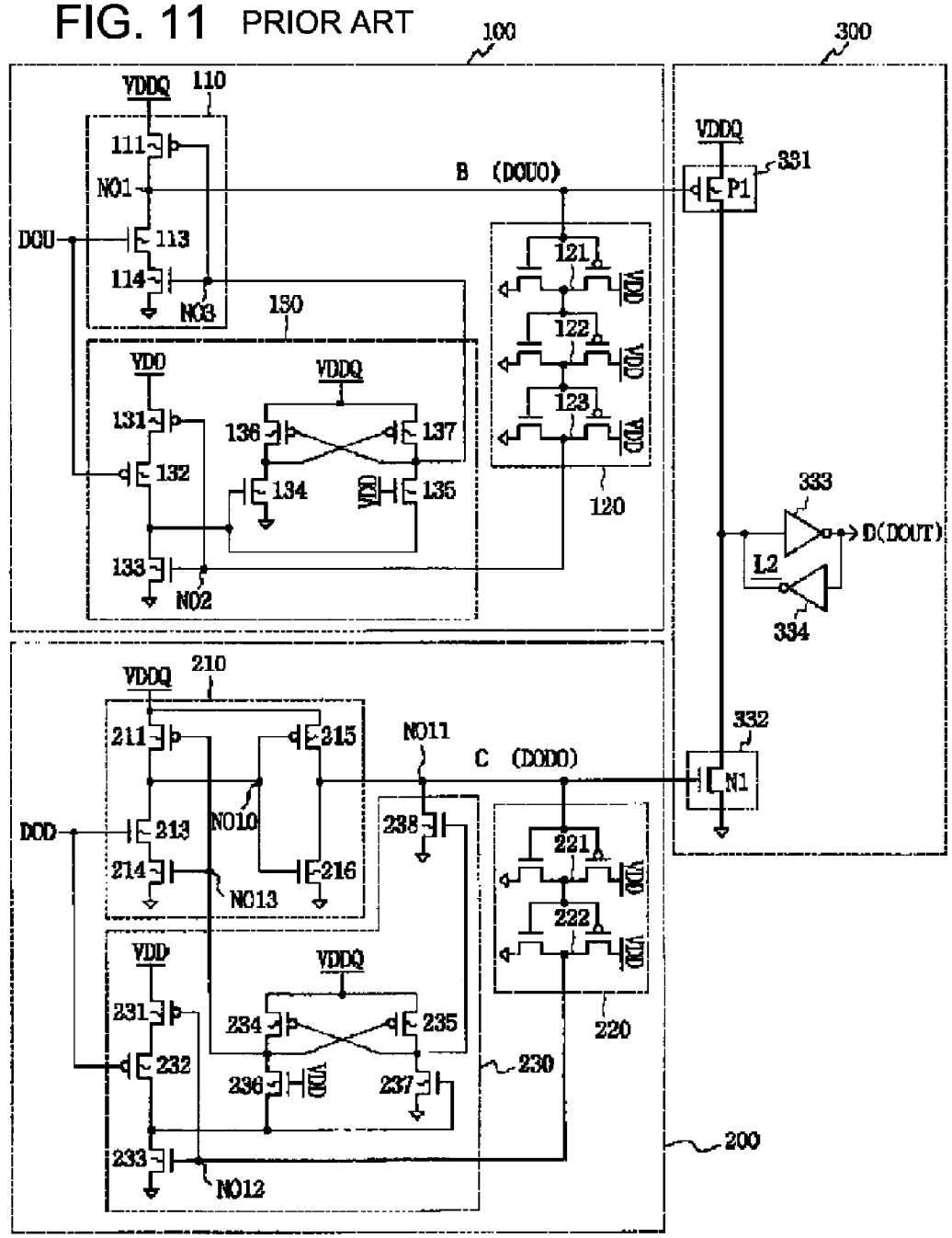
FIG. 11 is a diagram showing an example of a configuration of a level shift circuit in Patent Document 1.
Figure 12:
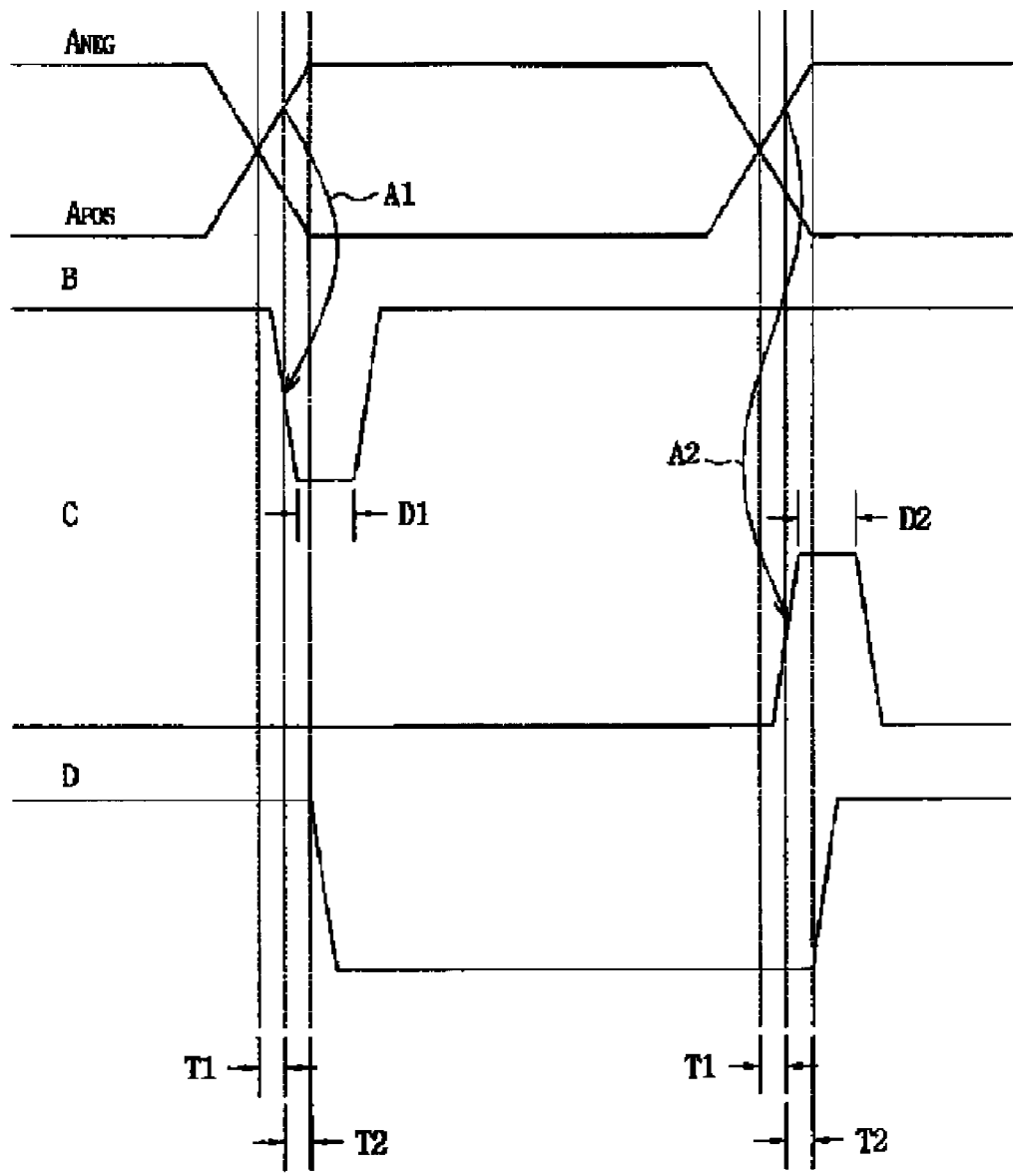
FIG. 12 is a diagram showing a timing operation of the level shift circuit in Patent Document 1.

Next, a seventh exemplary embodiment of the present invention will be described. FIG. 10 is a diagram showing a configuration of the exemplary embodiment of a data driver (also referred to as a display driver or a column driver) of a display device of the present invention. FIG. 10 shows an exemplary embodiment where the level shift circuit of the present invention has been applied to a level shift circuit of a multiple output driver. Referring to FIG. 10, the multiple output driver includes a data receiver circuit 81 that receives a small-amplitude differential signal (display data), a serial-to-parallel conversion circuit 82 that performs serial-to-parallel conversion of an output of the data receiver circuit 81 based on a timing control signal, a latch address selector that receives parallel outputs of the serial-to-parallel conversion circuit 82 and selects latch addresses, based on a timing control signal 2, a latch 83 that latches parallel outputs selected by the selector, level shifters 84 that level shift outputs of the latch 83, digital-to-analog conversion circuits (DACs) 85 that receive reference voltages of mutually different levels from a reference voltage generation circuit 87 and outputs gray scale voltages corresponding to video data, output buffers 86 that receive output voltages of the digital-to-analog conversion circuits (DACs) 85 to drive data lines, and a bias voltage generation circuit 88 that supplies a bias voltage to the data receiver circuit 81, level shifters 84, and output buffers 86. The level shifters 84, digital-to-analog conversion circuits (DACs) 85, and output buffers 86 are driven by power supply voltages (VE1, VE2). Outputs of the output buffers 86 are respectively connected to the data lines of a display panel. Video signals from the data lines are written into pixels scanned and selected for each line by a scan driver not shown, and display is thereby performed. As a pixel, a liquid crystal element, or an organic EL (Organic Electroluminescence) element may be used.

In the configuration shown in FIG. 10, each of the level shifters 84 includes the level shift circuit described in one of the exemplary embodiments. By applying the level shift circuit of the present invention, a data driver with low power consumption and a high-speed operation can be implemented. Cost reduction due to area saving can also be achieved.

Each disclosure of Patent Document listed above is incorporated herein by reference. Modifications and adjustments of the exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A level shift circuit comprising:
   an input terminal supplied with an input signal that is to be level-shifted;
   an output terminal at which an output signal is outputted;
   a first power supply terminal supplied with a first voltage;
   a second power supply terminal supplied with a second voltage;
   first to third transistors connected in series between the first power supply terminal and the second power supply terminal;
   fourth and fifth transistors connected in series between the first power supply terminal and the second power supply terminal; and
   a first delay circuit having an input connected to a connection node of the fourth and fifth transistors to deliver a delayed signal having a phase reversed to a phase of a signal received at the input thereof;
   the connection node of the fourth and fifth transistors being connected to the output terminal,
   a control terminal of one of the second and third transistors and a control terminal of the first transistor being connected in common to an output of the first delay circuit,
   the input signal of an amplitude range between third and fourth voltages applied to the input terminal being supplied to a control terminal of the other of the second and third transistors,
   a connection node of the first transistor and the second transistor being connected to a control terminal of the fourth transistor,
   a complementary signal of the input signal being supplied to a control terminal of the fifth transistor,
   the first and fourth transistors being of a first conductivity type and the second, third, and fifth transistors being of a second conductivity type, the level shift circuit further comprising
   a first voltage holding circuit that controls to hold a voltage at a connection node, at which the connection node of the first and second transistors and the control terminal of the fourth transistor are connected together, to the first voltage,
   a high/low relationship of the second voltage with respect to the first voltage being equal to a high/low relationship of the fourth voltage with respect to the third voltage, and the input signal whose amplitude range is between the third and fourth voltages having a lower amplitude than the output signal whose amplitude range is between the first and second voltages.

2. The level shift circuit according to claim 1, wherein the first voltage holding circuit includes:
   a first current source connected between the first power supply terminal and the control terminal of the fourth transistor;
   a second current source connected to the first power supply terminal; and
   a first switch connected between an output of the second current source and the output terminal, the first switch being made conductive when the output terminal assumes the first voltage and being made nonconductive when the output terminal assumes the second voltage.

3. The level shift circuit according to claim 1, further comprising:
   a second delay circuit that delays the output signal at the output terminal in phase; and
   a sixth transistor of the second conductivity type connected in series with the fifth transistor between the output terminal and the second power supply terminal, the sixth transistor having a control terminal supplied with an output signal of the second delay circuit.

4. The level shift circuit according to claim 3, wherein the first delay circuit comprises
   one or odd number of stages of inverter circuits, the odd number being three or more, the inverter circuits receiving an output of the second delay circuit at a first stage thereof.

5. The level shift circuit according to claim 3, comprising:
   a second voltage holding circuit that controls to hold the voltage at the output terminal to the second voltage.

6. The level shift circuit according to claim 5, wherein the second voltage holding circuit includes:
   a third current source connected to the second power supply terminal; and
   a second switch connected between an output of the third current source and the output terminal, the second switch being made conductive when the output terminal assumes the second voltage, the second switch being made nonconductive when the output terminal assumes the first voltage.

7. A display driver comprising the level shift circuit as set forth in claim 1.

8. A display device comprising:
   the display driver as set forth in claim 7;
   the display driver outputting a signal obtained by digital-to-analog converting an output of the level shift circuit to a signal line of a display panel through an output buffer, as a gray scale signal.

* * * * *